United States Patent [19]

Donley et al.

[11] Patent Number: 5,002,798
[45] Date of Patent: Mar. 26, 1991

[54] METHOD FOR FORMING THIN SOLID LUBRICIOUS FILMS AND FILM ARTICLES MADE THEREBY

[75] Inventors: Michael S. Donley; Paul T. Murray, both of Dayton; Trice W. Haas, Kettering, all of Ohio

[73] Assignee: University of Dayton, Dayton, Ohio

[21] Appl. No.: 335,406

[22] Filed: Apr. 10, 1989

[51] Int. Cl.$^5$ .............................................. B05D 3/06
[52] U.S. Cl. .................................. 427/53.1; 427/42; 427/248.1; 427/253.1; 427/255.2
[58] Field of Search ................ 427/53.1, 42, 248.1, 427/255.1, 255.2; 219/121.6

[56] References Cited

U.S. PATENT DOCUMENTS

4,664,940  5/1987  Bensoussan et al. ............... 427/53.1
4,874,741  10/1989  Shaw et al. ......................... 427/53.1

Primary Examiner—Stanley Silverman
Attorney, Agent, or Firm—Killworth, Gottman, Hagan & Schaeff

[57] ABSTRACT

Thin films of solid lubricious metal chalcogenides, such as $MoS_2$, are grown on stainless steel substrates by pulsed laser evaporation (P.L.E.). X-ray photoelectron spectroscopy of PLE deposited $MoS_2$ films grown at substrate temperatures up to 300° C. have the same stoichiometry as bulk $MoS_2$. $MoS_2$ PLE deposited films grown at 450° C. are sulfur rich. These laser-deposited films have a granular structure and exhibit none of the dendritic structures typically observed in sputter-deposited films. The coefficients of friction of PLE films were measured in laboratory air and ranged from 0.09–0.25; the majority of values were between 0.16 and 0.20. These frictional coefficients are in the appropriate range for a solid lubricant.

10 Claims, 7 Drawing Sheets

$T_{SUB}: 300°C$

FIG-8

$T_{SUB}: 450°C$

FIG-9

RAMAN SHIFT (cm$^{-1}$)

METHOD FOR FORMING THIN SOLID LUBRICIOUS FILMS AND FILM ARTICLES MADE THEREBY

FIELD OF THE INVENTION

The invention relates to methods of providing thin, solid lubricious films by use of a pulsed laser evaporation (PLE) technique and to the films produced thereby.

BACKGROUND OF THE INVENTION

Thin films of $MoS_2$ are currently the solid lubricant of choice for high precision spaceborne applications such as satellite mechanism bearings, gears, gimbals and splines. The current state-of-the-art solid lubricant films are processed by sputtering. Here, atoms are ejected from a target by bombardment with energetic particles. The ejected or sputtered particles can be condensed on the substrate to form a thin film. To obtain high purity films by sputtering, the process must be done in a vacuum, which then requires the use of radio frequency irradiation or dc electron discharge to maintain high sputter rates. The sputtering process has a number of inherent variables (e.g., target voltage, current system pressure, etc.) which make it a very complex process. Sputtering parameters must be adequately controlled to produce films with the desired properties.

Sputtered $MoS_2$ films typically exhibit a "wormlike" morphology which is characteristic of an arrangement of $MoS_2$ platelets that are perpendicular to the substrate surface. Such a film microstructure is sensitive to oxygen and moisture contamination which results in poor lubrications properties. Furthermore, sputtered films typically are soft and, during wear, may produce undesirable amounts of wear debris. In precision spaceborne applications, the presence of wear debris can be disastrous for device performance. These soft films also typically exhibit poor adhesion to the substrate.

The properties of thin $MoS_2$ films grown by PLE under a variety of deposition conditions are disclosed herein[1]. PLE[2][3][4] is a film deposition method which possesses a number of inherent advantages over conventional deposition processes such as r.f. sputtering. These advantages include congruent target evaporation, the capability of growing high purity films, and the relative ease with which many materials can be evaporated. In comparison with sputtered films, PLE-deposited films typically have superior structural properties owing to the presence of ions and other excited species in the evaporant plume. Furthermore, the inherent simplicity of PLE as compared with sputtering is another distinct advantage.

[1] See also M. S. Donley, P. T. Murray, J. T. Grant, N. T. McDevitt and T. W. Hass, "Thin Solid Films", submitted for publication (not published as of filing date).

[2] H. M. Smith and A. F. Turner, *Appl. Opt.*, 4 (1965) 147.

[3] B. D. Favitsanos and W. E. Sauer, *J. Electrochem. Soc.*, 115 (1968) 109

[4] H. Schwartz and H. A. Tourbellot, *J. Vac. Sci. Technol.*, 6 (1969) 373

The tribological properties of $MoS_2$ thin films are determined by the film stoichiometry, impurity content, morphology, crystal structure and orientation. There is a need for deposition processes which produce films with minimum contamination, especially reduced oxygen content, and optimum crystal orientation. The present disclosure details the deposition and properties of PLE-deposited thin films. X-ray photoelectron spectroscopy (XPS) was utilized to investigate film surface chemistry. Film crystal structure and orientation were examined using low angle X-ray diffraction (XRD) analysis. Coefficient of friction measurements illustrate the lubrication properties of the films.

SUMMARY OF THE INVENTION

In accordance with the invention, thin films of metal chalcogenides, such as $MoS_2$, are formed via pulsed laser evaporation (PLE). This entails irradiating a target composed of the thin film material of interest. By focusing the laser beam at the target, it is possible to increase the laser power density at the target such that evaporation of the target material occurs. A thin film of this material is then grown by placing an appropriate substrate close to the plume.

The laser beam is focused at the target causing flash evaporation and producing a plume of evaporated material. During film growth, the laser beam is scanned across the target in a uniform pattern. This facilitates deposition of a uniform film.

The target is mounted on a stage that is rotated during the deposition process, thereby resulting in uniform evaporation of the target material. The substrate is mounted on a second stage that allows the substrate to be independently heated (and rotated, if necessary) by conventional means during film growth. All of these components are preferably mounted within a vacuum chamber.

Two alternative techniques provide for the incorporation of additional components into the films. The first entails taking advantage of target rotation. This mode involves placing an additional target, such as Ni, next to the original target material, such as $MoS_2$. Rotation of this compound target under the laser beam then results in evaporation of both components. By properly timing the rotation speed of the targets with the laser timing, a uniform film consisting of both components can then be grown. The composition of the films can then be controlled by careful choice of the relative target areas exposed to the laser beam.

The second mode entails evaporating the second component, such as Ni, directly onto the $MoS_2$ target. The resulting $Ni/MoS_2$ structure would then be used as a target and subjected to pulsed laser evaporation. This method ensures uniform laser evaporation of both components. The composition of the film can then be controlled by careful control of the Ni evaporation rate onto the $MoS_2$ target. Elements other than Ni, e.g., Au, can also be incorporated in this fashion.

Figure 1:
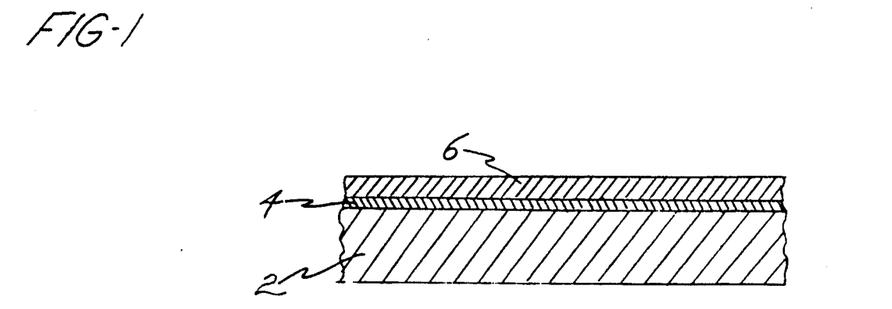
FIG. 1 is a schematic representation of one type of solid lubricant film-substrate structure in accordance with the invention.

Finally, to optimize the lubrication properties of the deposited film, a multi-component film structure may be used. Here, a thin (less than 1000 Å) film of a hard material (e.g. $TiB_2$, etc.) is put down before the $MoS_2$ film is deposited. Such a structure is shown in FIG. 1.

Growth of solid lubricant films by pulsed laser evaporation has a number of advantages over the older methods, such as sputtering. These include the ability to grow high purity films (since the target becomes its own crucible), congruent target evaporation (producing films with the same chemical composition as the target which greatly simplifies the deposition procedure), and improved structural properties of the films due to the presence of ions and excited neutral species in the evaporant plume. The solid lubricating films grown by this technique have excellent adherence to the substrate and have excellent lubricating properties in air, unlike most-sputter deposited films.

The invention will be further explained in conjunction with the following detailed description and the appended drawings.

In the drawings:

DRAWINGS

FIG. 3 is an Auger spectra of PLE films in accordance with the invention;

DETAILED DESCRIPTION OF THE PREFERRED EMBODIMENT

Figure 2:
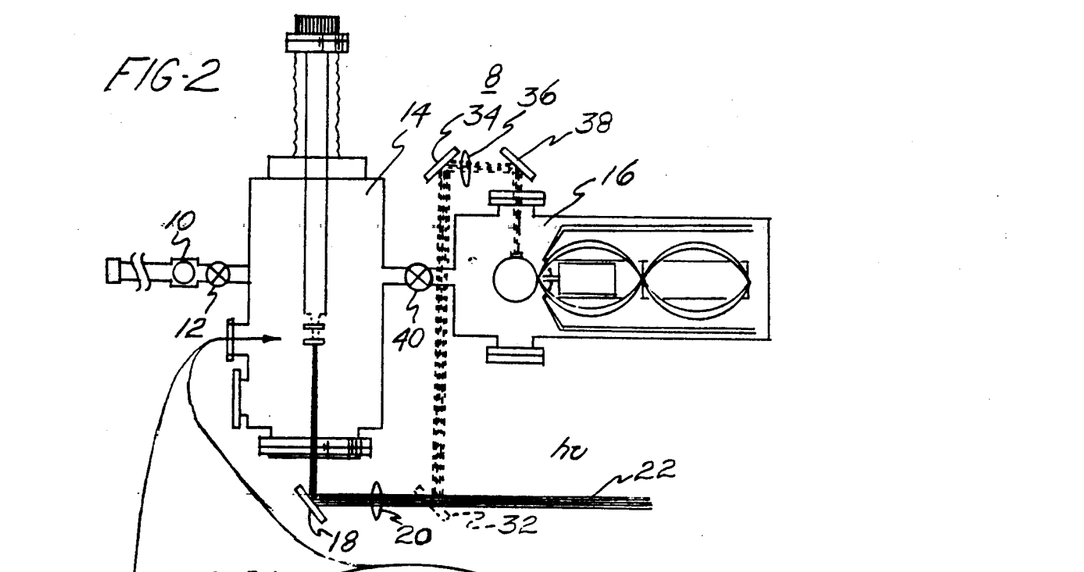
FIG. 2 is a schematic of a pulsed laser evaporation (PLE) apparatus and adjoining analysis chamber that may be used.

Turning to FIG. 2 of the invention, there is shown a film growth apparatus that may be used to form the PLE grown solid, lubricious films of the present invention. Here, the apparatus 8 comprises a deposition chamber 14, which is connected through valve 40 to a Perkin-Elmer PHI Model 550 XPS/AES surface analysis system 16. Photons 22 of light emanate from a Q switched Nd:YAG laser (not shown) having a wavelength, $\lambda$, of 0.53 $\mu$m, and a pulse width of 15 ns. This pulsed beam of light was focused to a 0.9 mm diameter spot at target 24 (typically $MoS_2$) (FIG. 2a) by means of lens 20 and mirror 18 in order to evaporate material from the target. The target to substrate 26, distance was approximately 3 cm. It is to be understood that, in accordance with conventional techniques, the target 24 can be rotated and that substrate 26 can also be rotated to enhance uniformity of the deposited film.

Figure 2A:
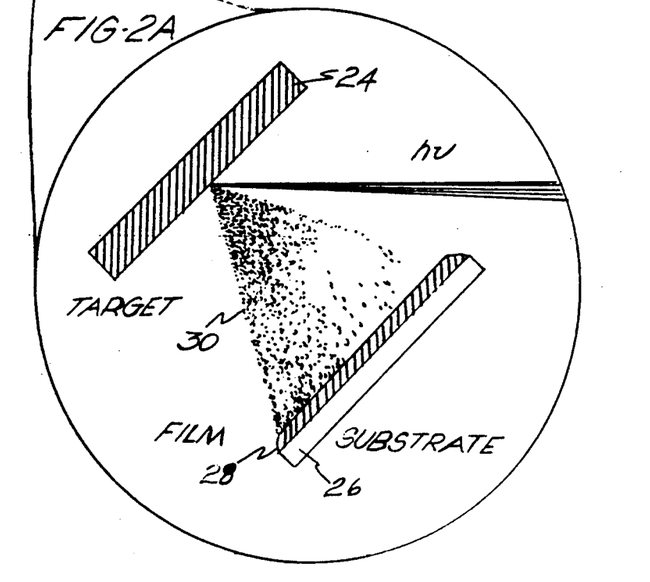
FIG. 2a is a magnified view of a section of the PLE apparatus shown in FIG. 2, showing the target evaporation and subsequent deposition of target material onto the desired substrate.

Upon operation, (FIG. 2b) the light beam hv evaporates material from the target to form a plume 30 of target material that is deposited as film 28 on substrate 26.

Experimental Equipment Parameters

For purposes of actual film growth performed in accordance with the invention, the laser was operated at a repetition rate of 5 Hz and an energy of approximately 5 mJ per pulse at the target. The beam was stepped across the target at a rate of 0.5 mm $s^{-1}$. The base pressure in the deposition chamber was $2 \times 10^{-8}$ Torr, which increased to approximately $2 \times 10^{-7}$ Torr during film deposition. The base pressure in the analysis chamber was $2 \times 10^{-10}$ Torr.

The $MoS_2$ target was prepared by hot pressing commercial grade $MoS_2$ powder (99% purity) purchased from (CERAC Inc., Butler, Wis. 53007). Hot-pressed targets are more adaptable to large-scale commercial use than single-crystal $MoS_2$. In addition, incorporation of additives which enhance film properties is easily done with the hot-pressing technique. Pellets (1.25 cm diameter, 2 cm thick) were pressed at 27.5 M Pa and 1000° C. Wafers, approximately 2 mm thick, were cut from the pellets and were used as targets. Analysis of the wafers by X-ray diffraction indicated that the hot-pressed material was indeed hexagonal $MoS_2$. However, a considerable amount of preferred crystal orientation was also observed, with basal plane orientation parallel to the wafer surface. The targets were cleaned prior to film growth by laser irradiation in the deposition chamber. Studies with an air-cleaved single crystal of $MoS_2$ were also made for comparison.

The substrates consisted of polished 300 series stainless steel pieces (1 cm $\times$ 1.5 cm) of various thicknesses. All substrates were cleaned by an acetone and methanol solvent rinse prior to being loaded into the deposition chamber. The substrates were nominally at room temperature during film deposition.

After film formation, a transfer arm is used to move the film from the deposition chamber to the analysis chamber to allow subsequent XPS and Auger analysis of the PLE deposited film without exposure to air. A second, stand-alone deposition chamber was utilized when surface analysis was not required.

As to the chamber 16, a transfer arm (not shown) may be placed through valve 12 and used to transfer PLE grown film to chamber 16 for purposes of analysis. Although not at all critical, an alternate mirror 32 may be used to deflect photons 22 to mirror 34, through lens 36, and off of mirror 38 so that the laser may be used to perform several analytical techniques on a PLE sample film disposed in chamber 16.

Oscillatory friction and wear experiments were conducted under room atmosphere conditions using a conventional reciprocating ball-on-flat apparatus. The $MoS_2$ coated specimens were mounted on a reciprocating actuator arm (not shown in FIG. 2) to contact the ball apparatus. The actuator arm was supported by externally pressurized gas bearings and was capable of smooth, vibrationless linear motion. Reciprocating motion was provided by an offset cam linkage attached to a constant-speed motor (both not shown). The sliding speeds were relatively low which restricted frictional heating.

The ball specimen used for these experiments was held stationary in a clamp arrangement and was constrained by a transducer leaf spring assembly which allowed deflection under tangential force. Normal loads were applied by adding dead-weights above the ball specimen. The ball specimens used were as-received AISI 52100 steel balls ($\frac{1}{4}$ in diameter) quenched and tempered to 62 HRC.

Typically, the spring constant of the deflection system was made sufficiently low to exaggerate stick-slip in the detection system when a lubricant film was broken. By ensuring this situation, film rupture was accompanied by high friction and erratic vibration, which were readily detected. The cantilever assembly was designed originally to respond smoothly under conditions of low friction (approximately 0.05–0.08) characteristic of boundary lubrication, and to respond with stick-slip under conditions of relatively high friction (0.15–0.20) characteristic of dry sliding. For this reason, friction measurements of the $MoS_2$ films made with the cantilever-LVDT assembly appeared to be relatively erratic. System response was improved by mounting a sensitive strain gauge load cell against the spring assembly. This effectively increased the stiffness of the assembly and allowed for more consistent measurement of coating friction.

Experimental Procedure

XPS data were obtained using a non-monochromatized Al K$\alpha$X-ray source operating at 600 W. The spectrometer was calibrated using the Cu($2p_{3/2}$) and Cu($3p$) photoelectron peaks at respective binding energies of 932.7±0.05 eV and 75.1±0.05 eV, as specified in the current American Society for Testing and Materials (ASTM) calibration procedure[5].

[5]ASTM publication No. E902-88:
Standard practice for checking the operating characteristics of an X-ray photoelectron spectrometer, 1988 (American Society for Testing and Materials).

The $MoS_2$ targets were prepared by hot pressing commercial grade $MoS_2$ powder. Analysis of the hot-pressed $MoS_2$ by X-raY diffraction confirmed that the material was indeed hexagonal $MoS_2$. The targets were cleaned prior to film growth by laser irradiation in the deposition chamber. The substrates were 440 C stainless steel (2.54 cm×1.25 cm×0.23 cm) which were lightly polished and solvent cleaned prior to deposition. $MoS_2$ films were grown at: room temperature, 200°, 300° and 450° C. The substrate temperature was measured using a calibrated IR pyrometer in the deposition-analysis system and a thermocouple in the stand-alone deposition system.

For these initial experiments, friction and wear evaluations were made at three stress levels: 50, 75 and 100 klbf in$^{-2}$ peak hertzian contact stress. For each experiment, a new test ball was used. The test balls were mounted in the ball holder and were bulk degreased using chloroform. Following chloroform degreasing, the balls were rinsed in aerosol freon, wiped with a Kimwipe tissue to remove residual surface films and then rinsed again with aerosol freon.

The coated specimens were stored in laboratory air for approximately two weeks prior to testing. The films were tested with no additional cleaning. Room temperature and humidity were monitored during the experiments. The room temperature was kept constant (24±1° C.), while humidity ranged between 20% and 30% during the course of the experiments.

Sliding contact was continued until film wear-through or rupture occurred. This condition was assessed by examining the nature and general level of the friction traces. Initial friction coefficients were seen to be smooth and relatively free of stick-slip-induced vibration. The final friction coefficient traces exhibited stick-slip vibrations typical of metal-metal sliding contact. This latter feature often made the assessment of coating breakthrough difficult. For some coatings, breakthrough appeared to occur over a portion of the film, whereas other portions of the film remained intact. Results of these tests are discussed infra.

$MoS_2$ Film Stoichiometry

The stoichiometry of the PLE-deposited $MoS_2$ films was investigated by XPS. Survey scans (550–50 eV binding energy) were taken at 50 eV pass energy; high resolution scans of individual peaks were obtained using 15 eV pass energy. Results are summarized in FIG. 3 and Table 1.

TABLE I

Quantitative analysis of $MoS_2$ target and PLE-deposited $MoS_2$ thin films[a]

| Specimen | S (at. %) | Mo (at. %) | C (at. %) | O (at. %) | S/Mo |
|---|---|---|---|---|---|
| $MoS_2$ target | 30 | 16 | 43 | 11 | 1.79 |
| Film (room temperature) | 50 | 28 | 15 | 7 | 1.77 |
| Film (200° C.) | 49 | 27 | 18 | 6 | 1.79 |
| Film (300° C.) | 49 | 27 | 15 | 9 | 1.82 |
| Film (450° C.) | 38 | 19 | 33 | 10 | 2.04 |

[a]Based on photoelectron peak height sensitivity factors of Briggs and Seah[6]

The XPS survey scan of the PLE-deposited $MoS_2$ film grown at 200° C. is presented as (a) in FIG. 3 and is representative of the $MoS_2$ film grown between room temperature and 300° C. in this study. The XPS survey scan of the $MoS_2$ film grown at 450° C. is presented for comparison in FIG. 3 as (b). The various Auger and photoelectron peaks for molybdenum, sulfur, carbon and oxygen are indicated in FIG. 3. From a comparison of the spectra, the 450° C. film has relatively higher sulfur, oxygen and carbon contents. A quantitative analysis of these data for films grown at room temperature, 200, 300 and 450° C., and for the $MoS_2$ target is presented in Table 1. Relative peak heights and the photoelectron peak height sensitivity factors from Briggs and Seah[6] were utilized to complete the quantitative analysis. The resulting calculated atomic percentages for molybdenum, sulfur, carbon and oxygen as well as the calculated Mo/S ratio are presented. The target spectrum was acquired from a specimen which had not been laser cleaned and consequently showed substantially higher levels of carbon and oxygen than the PLE-deposited films. From Table 1, the stoichiometries of the films grown between room temperature and 300° C. are identical and are the same as that of the target. Evaporation cleaning of the target decreased the surface contaminants, particularly carbon. The film grown at 450° C. is quite different, containing relatively higher amounts of carbon, oxygen and sulfur.

[6]D. Briggs and M. P. Seah(eds.): Practical Surface Analysis by Auger and X-ray Photoelectron Spectroscopy, Wiley, Chichester, 1983, Appendix.

Figure 4:
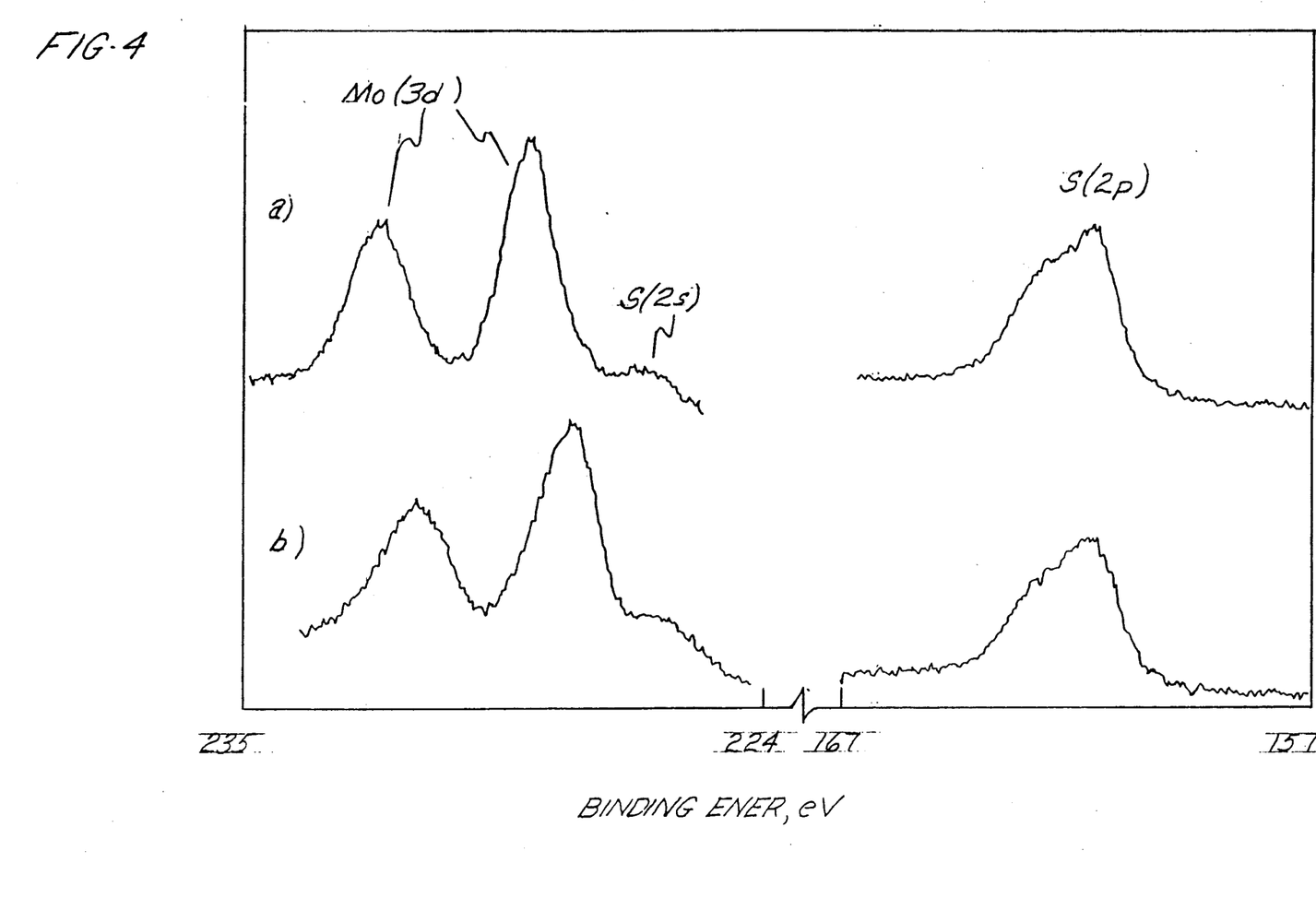
FIG. 4 is an XPS (X-ray photoelectron spectroscopy) spectra of PLE films produced in accordance with the invention.

High resolution XPS scans were obtained for the Mo($3d_{5/2}$) and the S($2p$) photoelectron peaks from the various films. Peaks for the 200° C. and 450° C. films are presented in FIG. 4 as (a) and (b) respectively. Again the peak shape of the 200° C. film is representative of the films grown between room temperature and 300° C. A compilation of peak energies and full width at half-maximum (FWHM) data is presented in Table 2. It is clear from a comparison of peak shapes and measured peak energies that the film grown at 450° C. is quite different in chemistry. The molybdenum peak energy is shifted (by approximately 1 eV) to a lower energy, towards the metallic chemical state, while the sulfur peak energy is constant; the Mo($3d_{5/2}$)−S($2p$) energy difference is therefore approximately 1 eV less for this film. It should also be noted that the photoelectron peak FWHMs are 15% larger in the 450° C. film, indicative of a more mixed chemical state.

TABLE 2

Measured photoelectron peak binding energies (BE) and FWHMs for PLE-deposited MoS$_2$ thin films

|  | Mo(3d$_{5/2}$) | | Mo(3d$_{3/2}$) | | S(2p) | |
|---|---|---|---|---|---|---|
|  | BE | FWHM | BE | FWHM | BE | FWHM |
| MoS$_2$ target | 229.1 | 1.1 | 232.3 | 1.4 | 162.3 | 2.1 |
| Film (room temperature) | 228.8 | 1.4 | 232.0 | 1.6 | 163.3 | 2.3 |
| Film (200° C.) | 229.0 | 1.4 | 232.2 | 1.7 | 162.1 | 2.3 |
| Film (300° C.) | 228.9 | 1.3 | 232.0 | 1.6 | 161.9 | 2.3 |
| Film (450° C.) | 228.0 | 1.7 | 231.1 | 1.9 | 161.9 | 2.3 |

MoS$_2$ Film Morphology

Figure 7:
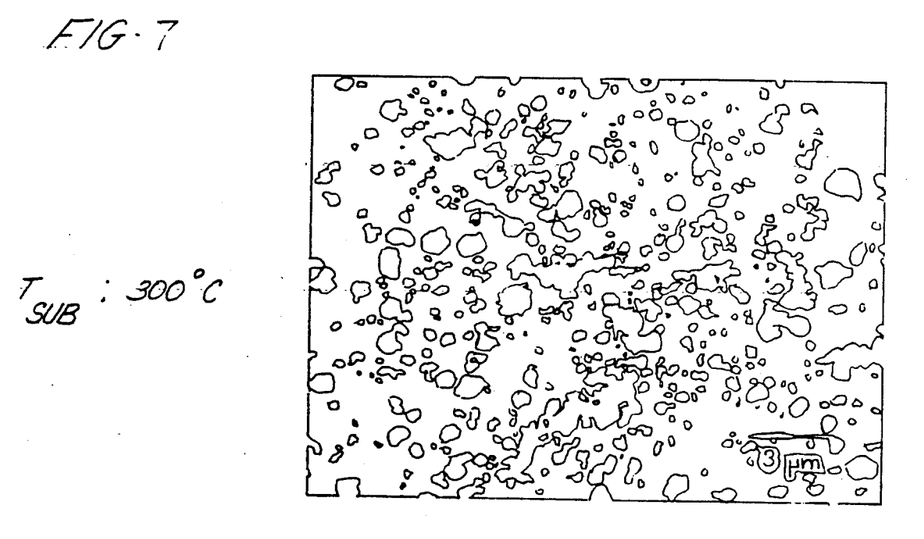
FIG. 7 is a drawing traced from a scanning electron micrograph of a PLE $MoS_2$ film grown at 300° C.
Figure 8:
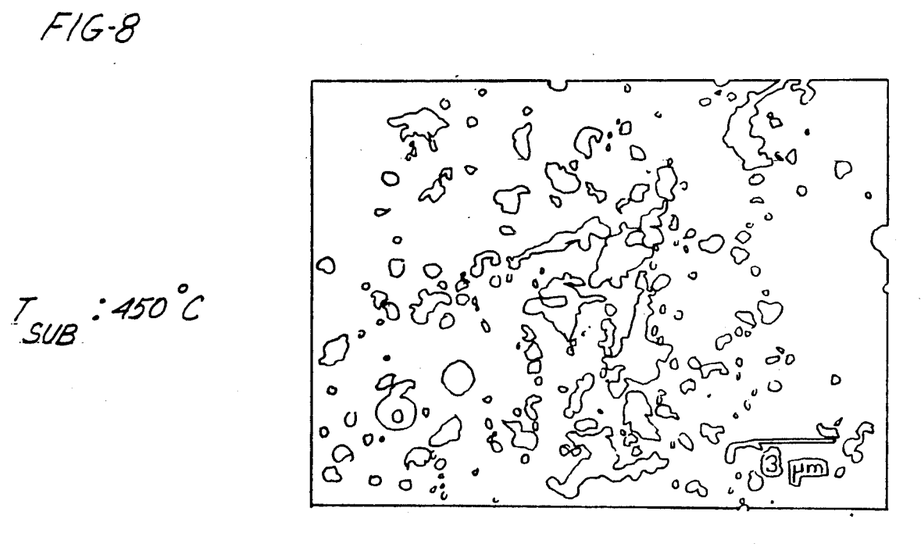
FIG. 8 is a drawing traced from a scanning electron micrograph of a PLE $MoS_2$ film grown at 450° C.

The morphologies of the PLE-deposited MoS$_2$ films are presented in the scanning electron photomicrographs of FIGS. 7 and 8. FIG. 7 shows the morphology of the 300° C. film and is representative of films grown between room temperature and 300° C. in this study. FIG. 8 shows the morphology of the film grown at 450° C. Both films were approximately 400 nm thick.

A number of spherical particles are present on these laser-deposited films, ranging from 0.25 to 1 μm in diameter. Such particles are typically observed on a variety of films of different materials at sufficiently high laser power densities. These particles are ejected from the target by splashing[7], a process which occurs when the subsurface region of the target is superheated by the incident laser radiation before the surface has evaporated. Additional evidence of splashing is present in the form of impact craters on the film. Splashing can be minimized by operating at a lower laser power density. The effect of splashing on the resulting friction and wear properties of the MoS$_2$ films is currently unknown.

[7]P. T. Murray, J. D. Wolf, J. A. Mescher, J. T. Grant and N. T. McDevitt, Mater Lett., 5 (1987) 250.

The underlying microstructure of the 300° C. film (FIG. 7) is that of a typical polycrystalline film with a granular structure. The 450° C. film (FIG. 8) is similar in microstructure to the 300° C. film but contains larger, more faceted particles which are not present in the 300° C. film. The 450° C. film also exhibits large "void" areas, indicating that the film did not grow uniformly. The film morphology observed in these PLE-deposited films is quite different from that typically observed in sputter-deposited MoS$_2$ films. Sputtered films typically have a substantial number of dendritic structures and generally exhibit a "wormlike" morphology[8,9] whereas such dendritic structures and "wormlike" morphology are absent in the PLE deposited MoS$_2$ films of the invention.

[8]J. R. Lince and P. D. Fleischauer, J Mater Res, 2 (1987) 827

[9]V. Buck, Vacuum, 36 (1986) 89

MoS$_2$ Film Crystallography

X-ray diffraction was carried out on a commercial Rigaku D/max-1B diffractometer equipped with a thin film attachment and a monochromator. Here, the angle of incidence of the Cu KαX-ray beam was maintained at a glancing angle (ranging from 1° to 10° from the surface), while the detector was scanned along 2θ.

Figure 5:
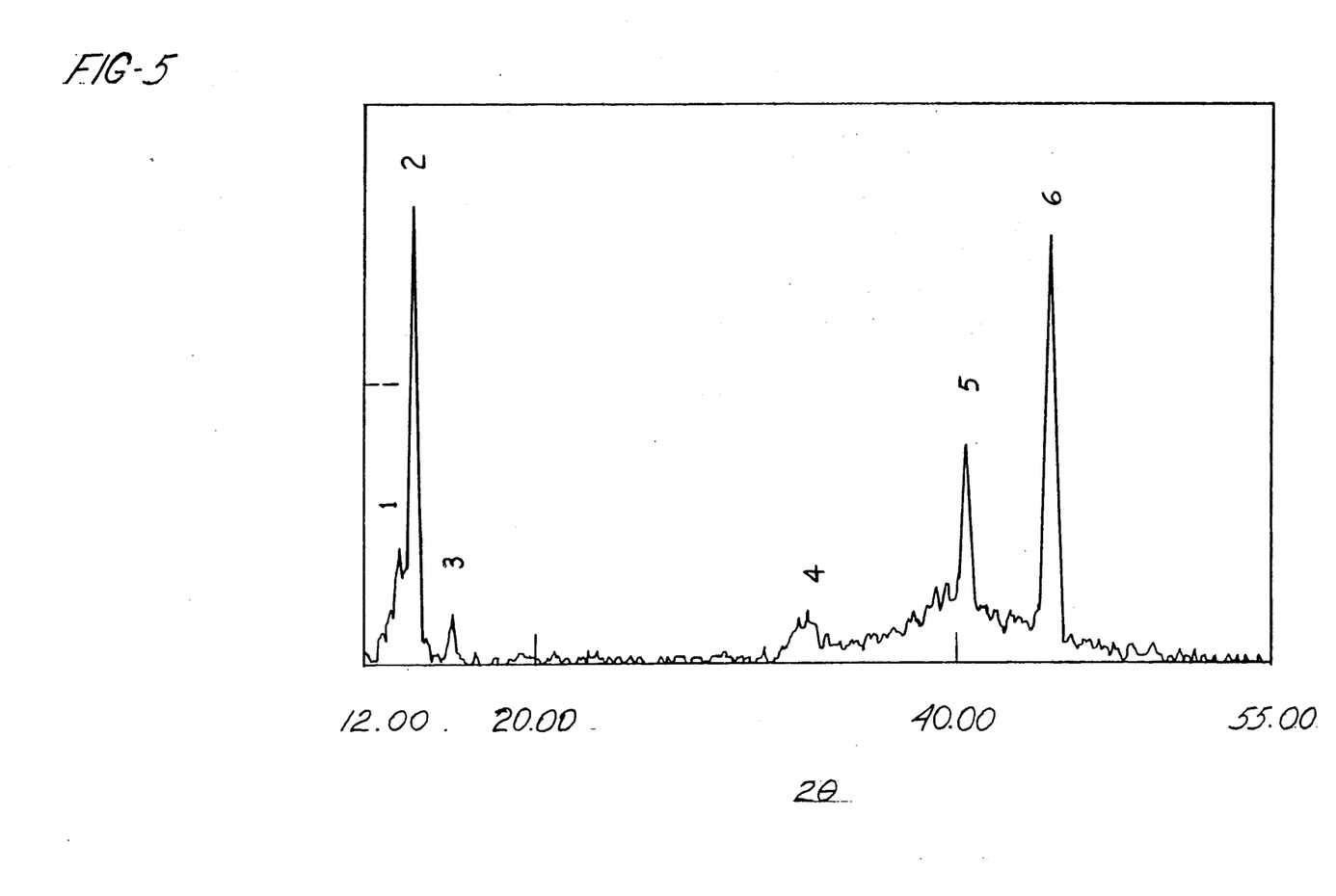
FIG. 5 is a grazing incidence X-ray diffraction spectrum of a $MoS_2$ film grown at 200° C.

The X-ray diffraction pattern for the PLE-deposited MoS$_2$ film grown at 200° C. is presented in FIG. 5. Here, the angle of incid the X-ray beam was 3° and the detector angle (2θ) was scanned between 12° and 55°. The d-spacing data for the six diffraction peaks are summarized in Table 3. The sharp peaks identified as numbers 2, 5 and 6 are produced by the (003), (101) and (009) reflections from the MoS$_2$ film; the broad peak (number 4) is produced by the (101) reflection. The stainless steel substrate diffraction peaks are evidence at $2\theta \approx 39°$. The origin of peak numbers 1 and 3 is currently unknown.

The measured film peak intensity ratio $(I/I_o)_m$ and the reported polycrystalline MoS$_2$ peak intensity ratio $(I/I_o)_{pf}$[10] are listed in Table 3. From a comparison of these intensity ratios, it can be concluded that the films are crystalline MoS$_2$, but do not consist of randomly oriented crystallites. The films exhibit a preferred orientation, with basal plane parallel to the substrate surface.

[10]T. J. Wieting and J. L. Verble, Phys Rev B, 3 (1971) 4286

TABLE 3

Summary of X-ray Diffraction Data

| Peak Number | d(A) | hkl (MoS$_2$) | $(I/I_o)_m{}^a$ | $(I/I_o)_{pf}{}^b$ |
|---|---|---|---|---|
| 1 | 6.491 | ? | 26 | — |
| 2 | 6.184 | 003 | 100 | 100 |
| 3 | 5.493 | ? | 11 | — |
| 4 | 2.742 | 101 | 9 | 23 |
| 5 | 2.227 | 015 | 47 | 27 |
| 6 | 2.032 | 009 | 93 | 4 |

$^a$Measured intensity ratio.
$^b$Reported intensity ratio from powder diffraction file[10]

Friction and Wear Evaluation of PLE-deposited MoS$_2$ Thin Films

Figure 6:
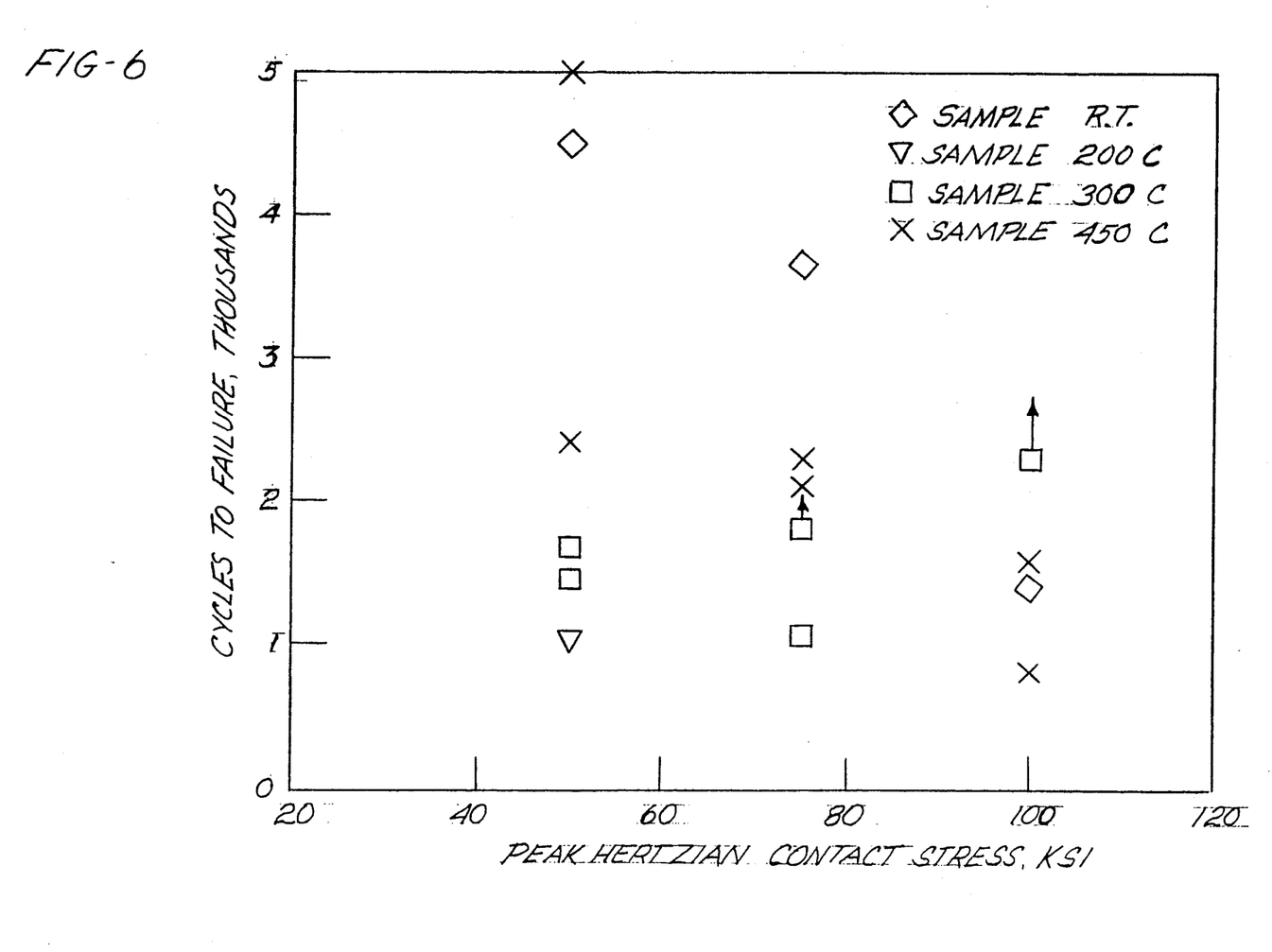
FIG. 6 is a composite plot graph of PLE $MoS_2$ coating durability data illustrating the general relationship between durability and contact stress.

The measured frictional properties of the PLE-deposited MoS$_2$ thin films are summarized in Table 4 and FIG. 6. The measured coefficients of friction for an AISI 52100 steel ball sliding against a coated AISI 440C stainless steel surface are presented in Table 4. FIG. 6 is a composite of all the coating durability data, where coating durability was measured by the number of cycles needed to effect coating breakthrough.

As indicated in Table 4, the measured friction coefficients for the PLE films ranged from 0.09 to 0.25, with the majority of the values falling between 0.16 and 0.20. The measured friction coefficient for an uncoated specimen ranged from 0.30 to 0.40, and is included for comparison. The film grown at 450° C. exhibited the highest friction coefficient, while the films grown at room temperature and 200° C. exhibited the lowest friction coefficients. However, there is a high level of scatter in these preliminary data. It is noted that the PLE films of the invention exhibit excellent coefficients of friction in air. In contrast, many of the prior art sputter produced films are adversely affected by air.

TABLE 4

Measured friction of AISI 52100 steel ball sliding against coated stainless steel surface in laboratory air

| Deposition temperature | Friction Coefficient at Maximum Peak Hertzian Contact Stress | | |
|---|---|---|---|
| | 50 klbf in$^{-2}$ | 75 klbf in$^{-2}$ | 100 klbf in$^{-2}$ |
| No coating | 0.30–0.40 | 0.30–0.40 | 0.30–0.40 |
| Room[a] | 0.10–0.15 | 0.09–0.11 | |
| Room[b] | 0.19–0.2 | 0.15–0.18 | 0.09–0.15 |
| 200° C.[a] | 0.11–0.13 | 0.10–0.19 | |
| 200° C.[b] | 0.18–0.20 | 0.14–0.18 | |
| 300° C.[b] | 0.14–0.17 | 0.14–0.16 | 0.09–0.2 |
| 450° C.[b] | 0.20–0.25 | 0.18–0.2 | 0.18 |

[a]Friction measured with linear variable differential transducer.
[b]Friction measured with strain gauge transducer.

FIG. 6 shows a composite of the coating durability data generated in these preliminary experiments. The two samples with arrows indicate experiments that were stopped before coating breakthrough occurred. The results of experiments conducted on a film grown at 200° C. and used in our preliminary experiments are not presented in this figure.

FIG. 6 is useful for illustrating the general data scatter observed for duplicate experiments conducted on the same film. For example, data for the 450° C. film exhibit little scatter at a contact stress of 75 klbf in$^{-2}$, while considerable scatter is seen in the 50 klbf in$^{-2}$ results. Likewise, data for the 300° C. film show little scatter at 50 klbf in$^{-2}$, but show significant scatter at 75 klbf in$^{-2}$. These results suggest that subsequent testing should consider triplicate experiments, rather than duplicate experiments.

Additional Crystal Structure Studies

Analysis by Raman Scattering was performed with incident laser light of 514.5 nm and at 500 mW intensity in laboratory atmosphere after deposition. The laser was focused onto the sample surface at an angle 80° from the surface normal. The inelastically scattered light was collected 90° from the incident beam and was focused onto the entrance slit of a Jarrel Ash 25-100 double monochromator. Raman spectra were recorded by averaging 16 scans for each sample.

Figure 9:
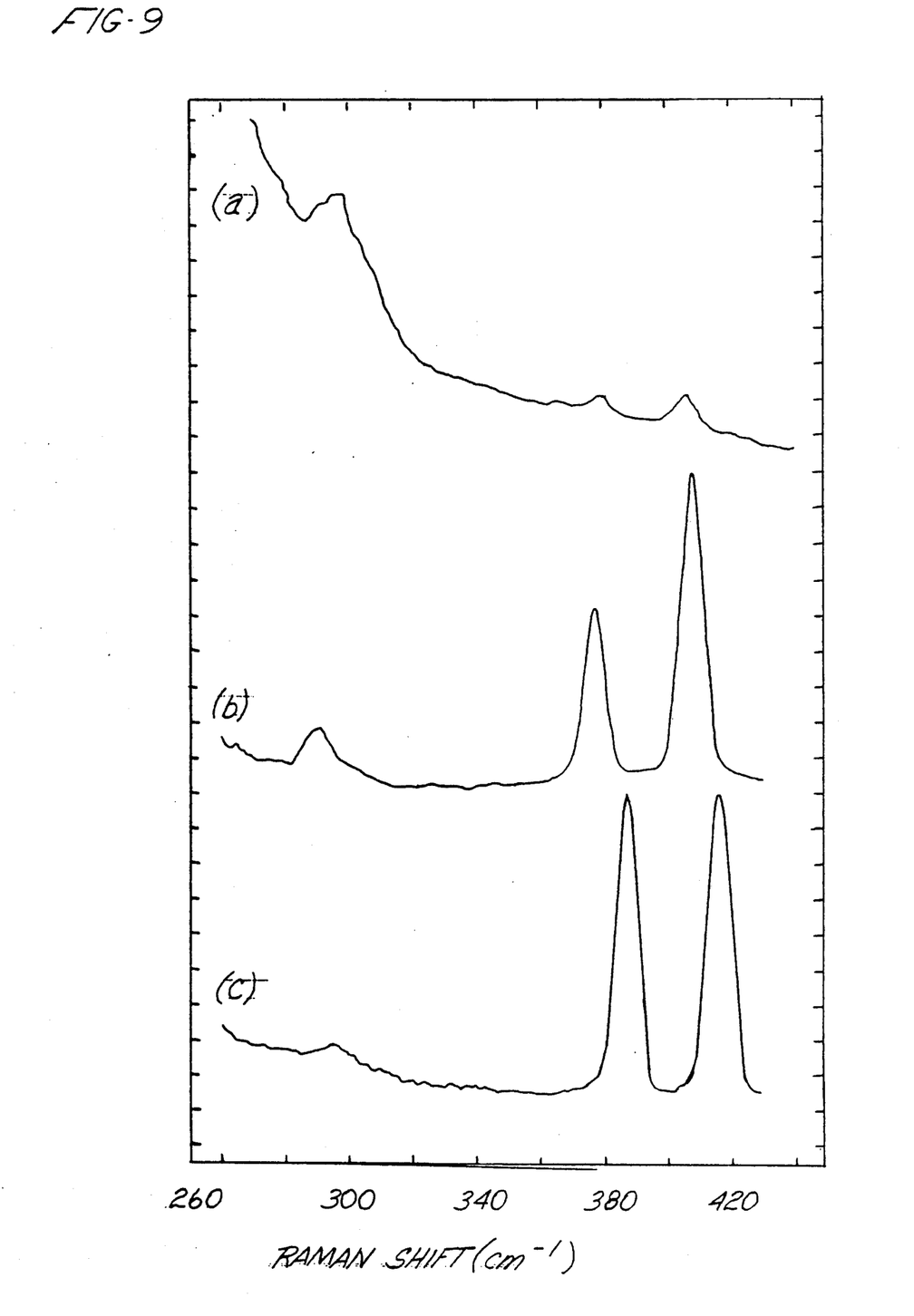
FIG. 9 is a Raman spectroscopy spectra of a PLE film, target, and single crystal.

Shown in FIG. 9 are the spectra (a) (b) and (c) corresponding to the Raman spectra obtained from the film, target and single crystal respectively.

Raman scattering from the film shows the lattice modes at 295, 378, and 406 cm$^{-1}$. The high background observed in FIG. 9, spectrum a is due to substrate scattering. Raman scattering from the target shows lines at 295, 379, and 405 cm$^{-1}$, while the spectrum obtained from the single crystal exhibits lattice modes at 294, 386, and 415 cm−1. The lines observed from the film and target are in excellent agreement (within experimental error) with each other, while the main lines from the single crystal appear at slightly higher (+2.5%) frequencies. Wieting and Verble[10] have reported Raman lines from MoS$_2$ at 287, 384, and 409 cm$^{-1}$, which are intermediate between those observed here from the laser-deposited film and those from the single-crystal standard. Slight frequency shifts in the same line for different samples indicate differences in the mass density of the film structure while maintaining the same crystal structure as the reference MoS$_2$. A change in crystal structure will produce a new set of lattice modes.

Conclusions Based on Experimental Results

Stoichiometric, crystalline MoS$_2$ thin films were deposited by PLE at substrate temperatures of room temperature, 200°, 300° and 450° C. The chemistry of these films was investigated by XPS. On the basis of a quantitative analysis of the XPS data, the films grown between room temperature and 300° C. exhibit a similar chemistry. The carbon and oxygen contents of these films are comparable and the calculated S/Mo ratios are identical, and also in agreement with the calculated S/Mo ratio of the hot-pressed MoS$_2$ target. The 450° C. film exhibits a somewhat different chemistry, with higher carbon, oxygen and sulfur contents. In addition, the molybdenum chemical state is shifted towards the metallic state. The morphology of the PLE-deposited film is that of an underlying granular structure with an overlayer of widely dispersed spherical MoS$_2$ particles. These particles are produced by "splashing", which is often evident in PLE films. The crystal structure of the PLE films was determined to be hexagonal MoS$_2$. The friction coefficients of the PLE-deposited films were measured at 50, 75 and 100 klbf in$^{-2}$ peak hertzian contact stress and ranged from 0.09 to 0.25. Although there is a wide range in the friction data, the friction coefficients are in the appropriate range for a solid lubricant (i.e., 0.15). The analyses of the films by Raman spectroscopy and glancing X-ray diffraction indicate that the resulting films are crystalline, hexagonal MoS$_2$, wherein the crystals exhibit basal plane orientation parallel to the substrate.

In conclusion, PLE is a very promising technique for depositing MoS$_2$ thin films. The technique possesses a number of advantages over more conventional deposition processes, including the capability of growing high purity films and the inherent simplicity of the method. PLE films are crystalline, of low friction, and are quite tenacious on the basis of preliminary friction and wear testing.

Operating Parameters Suggested by Experimentation

Any pulsed laser may be utilized in the PLE process that has a power density of from about $10^6$–$10^9$ watts/cm$^2$. As to the photon wavelength employed, this is not critical as long as the wavelength is absorbed by the particular target material.

The substrate may be at ambient or may be heated to temperatures of up to about 500° C. Based on experimental results, best adhesion to the substrate is demonstrated when the substrate is heated up to about 200° C. Based on all data available at present, it is preferred to grow films at temperatures from between 200° C. and 300° C.

It is preferred, but not necessary, to utilize a vacuum of at least about $10^{-4}$ torr during the PLE process.

Our experience is that, contrary to solid lubricant films deposited by sputter techniques, the PLE deposited films do not need to be "burnished" prior to use as a lubricant.

Turning now to FIG. 1 of the drawings, in accordance with the invention, a PLE deposited film 6 of solid lubricious material is provided over substrate 2, commonly stainless steel. An optional layer of hard coating material 4, e.g., Cr$_3$C$_2$ or TiB$_2$, may be provided intermediate the substrate 2 and solid lubricious film 6.

Lubricious film 6 can be from typically about 10–5000 Å in thickness with intermediate hard layer 4 being on the order of from 10–1000 Å in thickness.

However, lubricious films are not limited to this thickness range, and could be grown considerably thicker. The intermediate layer may be deposited on the substrate 2 via conventional techniques such as by sputtering, etc., or preferably by PLE before film 6 is deposited.

Although the experimentation to date has been conducted using a $MoS_2$ target and resulting PLE deposited $MoS_2$ film, it is thought that any lubricious metal chalcogenide film may be formed in accordance with PLE techniques. As used herein, metal chalcogenides include metal sulfides, selenides and tellurides, of Mo, W, Nb, V, Zr, Ti and Ta.

Also, the particular laser type used is not critical as long as a pulsed beam of sufficient wavelength and power density is used that is capable of evaporating the substrate material. For instance, $CO_2$ lasers can be used as well as YAG lasers. Acceptable laser beam sources include argon ion lasers, and excited dimer lasers of $F_2$, ArF, KrF, Xe Cl, $N_2$, etc.

While we have shown and described herein certain embodiments of our invention, it is intended that there be covered as well as any change or modification therein which may be made without departing from the spirit and scope of the invention as defined in the appended claims.

We claim:

1. Method of forming a solid lubricious metal chalcogenide film on a substrate comprising
   (a) providing a target material of metal chalcogenide selected from the group consisting of metal sulfides, selenides, and tellurides of Mo, W, Nb, V, Zr, Ti and Ta;
   (b) providing a substrate proximate said target material;
   (c) contacting said target material with photons of light from a laser to evaporate a portion of said target material and form a plume of evaporated metal chalcogenide; and
   (d) causing said plume to contact said substrate to thereby deposit a film of said metal calcogenide on said substrate.

2. Method as recited in claim 1 further comprising performing said steps (a)-(d) in a vacuum of at least about $10^{-4}$ Torr.

3. Method as recited in claim 1 further comprising rotating said target during said step (c).

4. Method as recited in claim 1 further comprising rotating said substrate during said step (d).

5. Method as recited in claim 1 further comprising heating said substrate during said step (d) to a temperature within the range of about 0° C.-500° C.

6. Method as recited in claim 1 wherein said step (c) comprises scanning said target with a pulsed laser beam having a power density of from about $10^6$-$10^9$ watts/cm$^2$.

7. Method as recited in claim 1 further comprising providing a second target material (e) composed of a material different from the material of said target provided in step (a); causing said photons to alternately contact said target provided in step (a) and said second target (e) to thereby deposit a film composed of both said target (e) and target (a) material on said substrate.

8. Method as recited in claim 7 wherein said target (e) is composed of Ni.

9. Method as recited in claim 7 wherein both said target (e) and said target provided in step (a) are disposed proximate each other, and comprising rotating both said targets under said photons of light to provide said alternate contact.

10. Method as recited in claim 1 wherein said target material comprises $MoS_2$ and wherein said film comprises $MoS_2$ substantially identical to said target material.

* * * * *